(12) United States Patent
Reime

(10) Patent No.: US 7,250,596 B2
(45) Date of Patent: Jul. 31, 2007

(54) CIRCUIT WITH AN OPTO-ELECTRONIC DISPLAY UNIT

(76) Inventor: Gerd Reime, Friedenstrasse 88, D-75328 Schömberg (DE)

(*) Notice: Subject to any disclaimer, the term of this patent is extended or adjusted under 35 U.S.C. 154(b) by 107 days.

(21) Appl. No.: 10/489,787

(22) PCT Filed: Sep. 21, 2002

(86) PCT No.: PCT/EP02/10630

§ 371 (c)(1),
(2), (4) Date: Mar. 16, 2004

(87) PCT Pub. No.: WO03/030363

PCT Pub. Date: Apr. 10, 2003

(65) Prior Publication Data

US 2004/0251402 A1 Dec. 16, 2004

(30) Foreign Application Priority Data

Sep. 25, 2001 (DE) .................................. 101 46 996

(51) Int. Cl.
H01J 40/14 (2006.01)
G01J 1/32 (2006.01)
G09G 5/00 (2006.01)

(52) U.S. Cl. ............... 250/221; 250/205; 250/222.1; 345/173; 345/175

(58) Field of Classification Search ................ 250/221, 250/205, 222.1; 345/156, 173, 175; 362/276, 362/464, 800, 802; 178/18.01, 18.09, 18.1
See application file for complete search history.

(56) References Cited

U.S. PATENT DOCUMENTS 4,204,204 A 5/1980 Pitstick 4,631,525 A * 12/1986 Serravalle, Jr. ............... 341/11
4,878,107 A 10/1989 Hopper (Continued)

FOREIGN PATENT DOCUMENTS

DE 28 24 399 12/1979

(Continued)

OTHER PUBLICATIONS

International Search Report for PCT/EP/02/10630 dated May 28, 2003.

*Primary Examiner*—Georgia Epps
*Assistant Examiner*—Don Williams
(74) *Attorney, Agent, or Firm*—Cantor Colburn LLP

(57) ABSTRACT

A circuit provided with an optoelectronic display unit. For discrete display of the settings of a regulating/control unit, said circuit comprises at least one detection element for detecting the actuation of an object in order to modify the settings of the regulating/control unit, whereby the detection element delivers an output signal corresponding to the desired modification. Several luminous diodes ($1a, \ldots, 1n$), which are essentially arranged next to each other in a row and which emit luminous radiation, are used as display elements. A control device controls at least one of the luminous diodes ($1a, \ldots, 1n$) according to the output signal in order to display the respective setting, in addition to the regulating/control unit for modification of the setting. In order to produce a quality display and operator unit, at least two receiver elements which are sensitive with respect to the luminous radiation of the luminous diodes ($1a, \ldots, 1n$) are provided, acting as detection elements in order to detect the luminous radiation reflected by at least one luminous diode ($1c$) and by an object (2), and the control device controls at least one of the luminous diodes in addition to the regulating/control unit as a result of the output signal, which is formed according to the movement of the object relative to the luminous diode ($1c$) emitting luminous radiation, according to the movement of said object.

26 Claims, 16 Drawing Sheets

U.S. PATENT DOCUMENTS

| | | | |
|---|---|---|---|
| 5,327,160 A | 7/1994 | Asher | |
| 5,789,738 A | 8/1998 | Reime | |
| 6,535,694 B2 * | 3/2003 | Engle et al. | 396/263 |
| 2003/0020004 A1 * | 1/2003 | Reime | 250/214 SW |
| 2003/0034439 A1 * | 2/2003 | Reime et al. | 250/221 |

FOREIGN PATENT DOCUMENTS

| | | |
|---|---|---|
| DE | 39 32 508 | 4/1991 |
| DE | 40 07 971 | 9/1991 |
| DE | 43 36 669 | 12/1994 |
| DE | 44 31 117 | 3/1996 |
| EP | 0 064 025 | 11/1982 |
| EP | 0 243 411 | 11/1987 |
| EP | 0 688 102 | 12/1995 |
| EP | 0 809 371 | 11/1997 |
| WO | WO 01/54276 | 7/2001 |
| WO | WO 01/54277 | 7/2001 |
| WO | WO 03/009476 | 1/2003 |

* cited by examiner

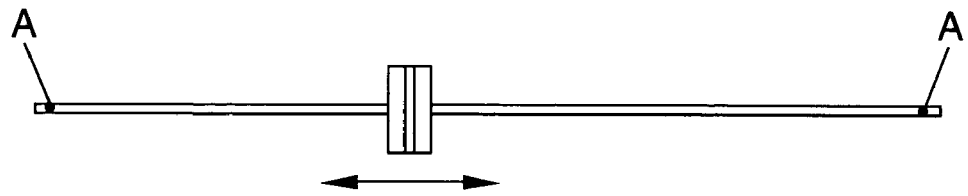
(prior art) FIG. 19
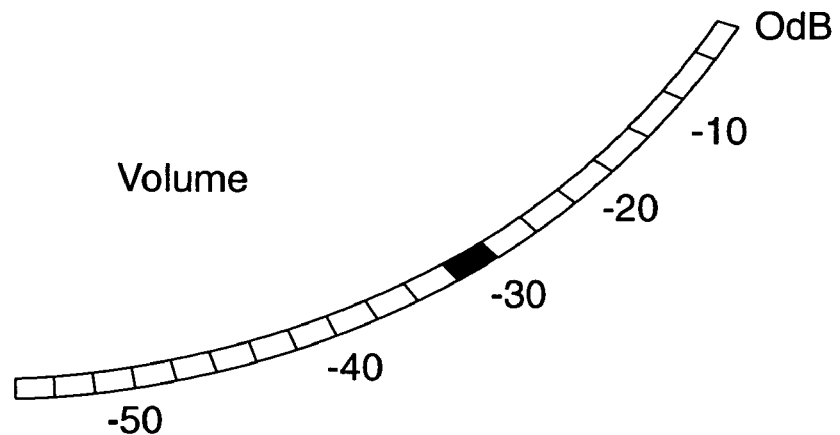
FIG. 20
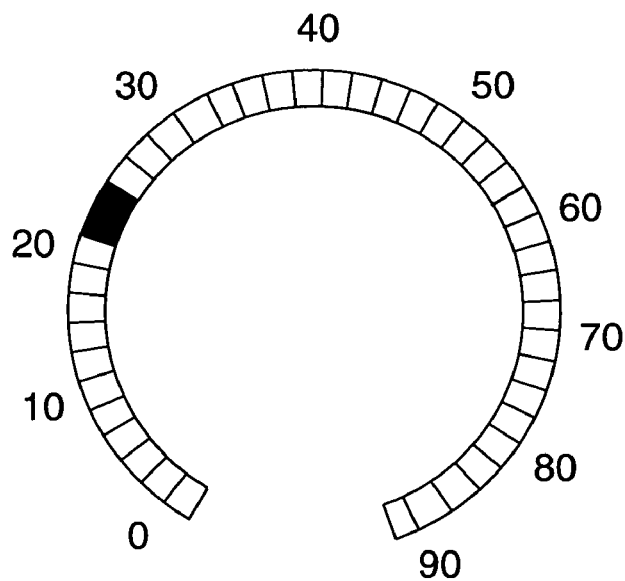
FIG. 21

CIRCUIT WITH AN OPTO-ELECTRONIC DISPLAY UNIT

REFERENCE TO RELATED APPLICATIONS

The present application claims the priority of the German patent application 101 46 996.9, filed on Sep. 25, 2001, the disclosure content of which is hereby expressly also made the subject matter of the present application.

FIELD OF THE INVENTION

The invention relates to a circuit comprising an optoelectronic display unit.

BACKGROUND OF THE INVENTION

In the field of operator control elements, displays formed e.g. by a series of LEDs are known, which indicate a set value. This may be a row of LEDs, i.e. light-emitting diodes, which are arranged side by side and of which one element emits light and indicates an actual value. As a rule, the luminescent elements arranged in a row are suitably labelled to enable an association with a quantity such as e.g. a display in "dB" for volume control. Changeover to another value is effected mechanically e.g. by means of momentary-contact switches. Generally, to increase and reduce the value one mechanical momentary-contact switch is used in each case. A change of value effected by pressing the appropriate momentary-contact switch is indicated by the appropriate LED in the row by virtue of a positional variation in the display.

FIG. 1 shows such an LED display known from the prior art, wherein the position of the LED and hence also e.g. the "volume level" may be adjusted by means of the plus and minus keys. The advantage of such an arrangement lies in the clear overview of the set position and in the spontaneous operator controllability. The drawback is, however, the need for mechanical cutouts in the operator control panel and the provision of appropriate keys.

From DE 43 36 669 C1 a touch panel is known, comprising optical sensors, which are associated with different actuating surfaces and react to the shading of a sensor surface corresponding to the size of a finger. The acquisition of the ambient light is therefore the information to be processed. Usually, for this purpose, a means other than the means used to generate a light signal is used. For indicating a value that is to be displayed an additional lighting display unit is required. The opto-receivers and opto-transmitters may be operated exclusively in a pulsed manner, which is disadvantageous for the discrete alteration of a value that is to be set (cf. also DE 40 07 971 A1 in the infrared range).

The acquisition of information, which is needed to vary a value to be set at an operator panel, may also be effected by means of touch-sensitive switching devices according to DE 694 19 735 T2 or DE 36 85 749 T2, which through the acquisition of a capacitance correspond with the optical display unit to be operated; because of its sensitivity to moisture, however, this use is restricted to specific areas.

DE 39 32 508 A1 shows a conventional reflection light barrier without a discrete control facility. Transmitters and receiving elements always have to be provided separately. DE 28 24 399 A1 discloses an optical switch with separate transmitters and receivers. In both cases, the light barriers formed thereby are only the means of setting the display and not the display means itself.

From U.S. Pat. No. 5,327,160 a touch fader as a remote control is known, which may be operated only in the switching mode.

Arrangements of light-emitting diodes, which may be used in turn both as a light-emitting and as a light-receiving element and the optical signal of which directly reproduces the value to be displayed, which may moreover be controlled so as to follow the movement of a finger or of a comparable body in order thereby to reach the value to be set, but which may also be operated in clocked manner and thus spontaneously, are not known from the prior art.

SUMMARY OF THE INVENTION

Proceeding from this background art, an advantage of one or more of various embodiments of the invention is to provide an advantageous display- and operator control unit and, for operator control of such a regulating/adjusting unit, to utilize the display itself as an operator control element, wherein both discrete regulation of values to be set and clocked handling is possible.

In an exemplary embodiment, a circuit with an optoelectronic display unit for the discrete display of the setting of a regulating/adjusting unit includes: at least one detection element for detecting the actuation of the regulating/adjusting unit by means of a body for changing the setting of the regulating/adjusting unit, wherein the detection element upon actuation supplies an output signal corresponding to the desired change; a plurality of light-emitting diodes disposed substantially side by side in a row and emitting optical radiation, the light-emitting diodes being formed as display elements of the display unit; a control device, which in dependence upon the output signal produced by the detection element controls at least one of the light-emitting diodes to display the respective setting as well as the regulating/adjusting unit to change the setting; wherein the control device controls at least one of the light-emitting diodes, the detection elements as well as the regulating/adjusting unit to follow the movement of the body on the basis of the output signal, which is formed in dependence upon the movement of the body relative to the light-emitting diode that is emitting optical radiation, and that either at least two receiving elements are provided, which are sensitive to the optical radiation of the light-emitting diodes and which as the detection elements detect the optical radiation emitted by at least one light-emitting diode and reflected by the body, or that at least one receiving element is provided, which is sensitive to the optical radiation of the light-emitting diodes and which as the detection element detects the optical radiation emitted by at least two light-emitting diodes and reflected by the body, wherein in both cases the control device, as soon as the control device because of the output signal advances the display unit in one direction to one of the next light-emitting diodes, also advances in the same direction the receiving element(s) being adjacent to the light-emitting diode emitting the optical radiation.

With the display unit formed by the light-emitting diodes receiving elements are associated in such a way that no separate mechanical keys are necessary. For operator control of such a regulating/adjusting unit, therefore, the display itself becomes the operator control element. There is therefore no need for either keys or cutouts for such keys. This, on the one hand, reduces the cost of manufacturing such an operator control unit and, on the other hand, enables the regulating/adjusting unit to be disposed under a closed, protective surface so that it—easy to clean and insensitive to dirt—has a long useful life and may be used for many applications.

In another exemplary embodiment, the light-emitting diodes are not only a display element but temporarily in turn a transmitting and receiving element, thereby making it possible further to reduce the circuit engineering outlay.

BRIEF DESCRIPTION OF THE DRAWINGS

The invention is described in detail below with reference to the accompanying drawings. The drawings show.

DETAILED DESCRIPTION OF PREFERRED EMBODIMENTS

The invention is described in detail below with reference to the accompanying drawings. However, the embodiments are merely examples, which do not restrict the inventive concept to a specific arrangement.

Figure 1:
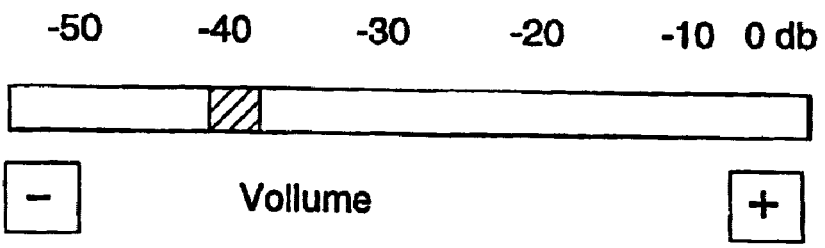
FIG. 1 a regulating/adjusting unit according to prior art.
Figure 2:
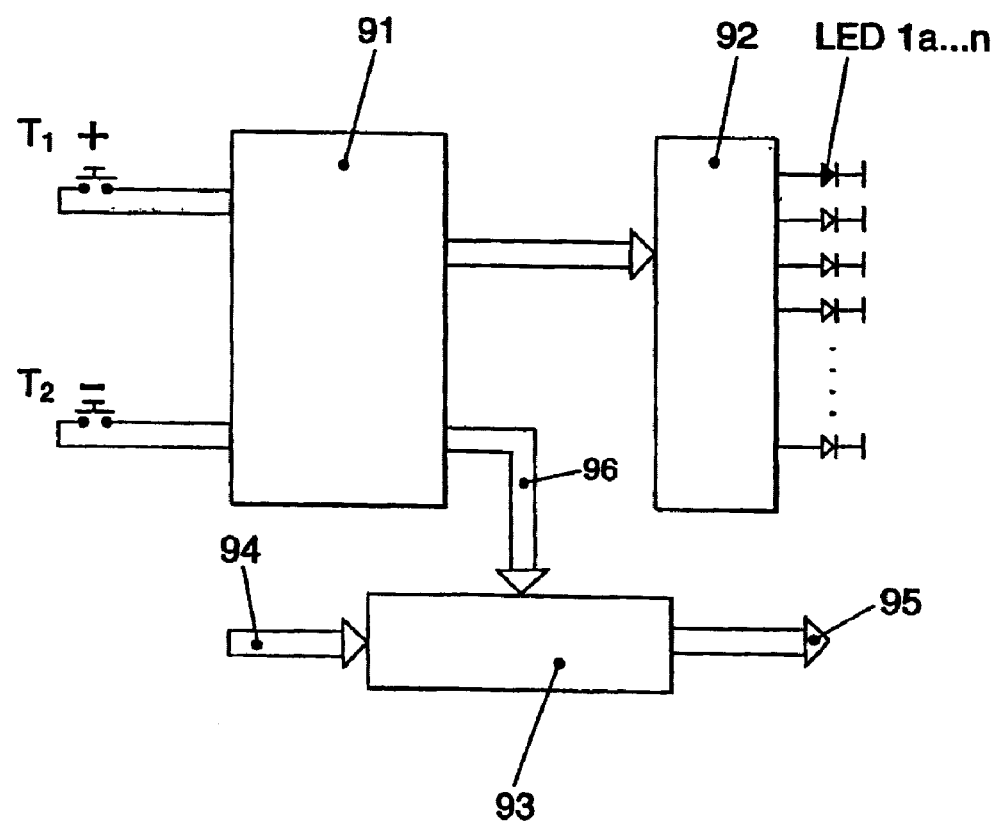
FIG. 2 a block diagram of a regulating/adjusting unit according to prior art.

In the prior art, the switching assignment for an adjusting unit according to FIG. 1 comprises according to FIG. 2 a counting device 91, the instantaneous state of which is determined by the key functions T1 (e.g. +key) and T2 (e.g. −key). Each time the keys T1 and T2 are actuated, the counting device 91 counts one value increment upwards and/or downwards and passes this information on to the display driver 92, which allows the LED corresponding to the set value to emit light. Parallel thereto, the set value is passed on to the control apparatus and/or the value regulator 93. This value regulator 93 regulates e.g. the amplitude of an analogue audio signal 94/95 in accordance with the set value 96. Thus, always at least one external control signal T1 or T2 is required for setting the value. The LEDs 1a . . . n merely display the set value and have no other function.

The invention described below dispenses with indirect information transfer with the aid of the keys T1 and T2, with the result that the information is received up and converted directly by the LED display.

To achieve this, the bifunctionality of the light-emitting diodes is used: these may emit light, when they are correspondingly driven by a current, or produce power and/or current, when they are correspondingly illuminated. If then, for example, low-crosstalk wiring is selected, a light-emitting diode may be operated sequentially as a transmitter and as a receiver. In principle, the same function is however realizable also by using alternative receiving elements such as e.g. photodiodes parallel to the light-emitting LEDs. In this case too, because of the overall size the display is still simultaneously the operator control element, even when the light-emitting diodes do not have the above double function.

Figure 3:
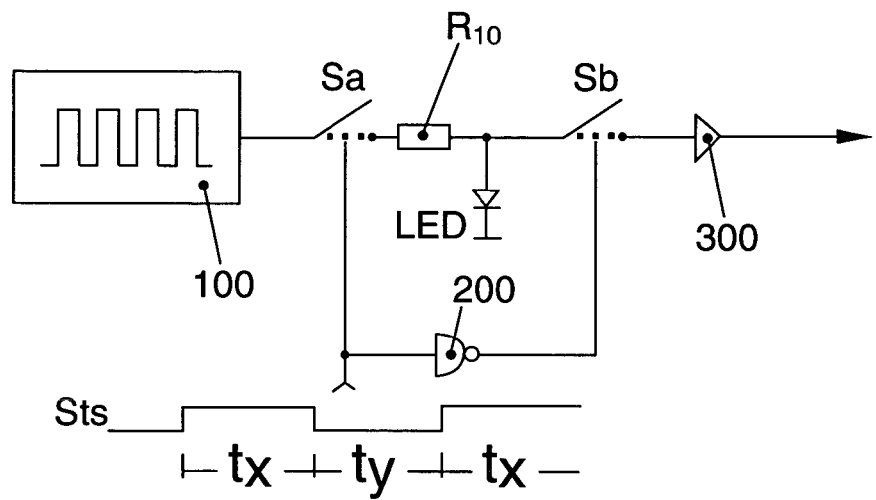
FIG. 3 a diagram for selection of an LED as a display- and operator control element, FIG. 4 a reflecting element usable for operator control above an LED row, FIG. 5 an arrangement for realizing a sensitive LED row, FIGS. 6, 7 the circuit according to the invention, FIGS. 8a-8e signal characteristics during momentary contact with an LED, FIG. 9 a circuit for selection of an outer-lying LED, FIG. 10 phases and amplitude relationship of the analogue output signal S17 of the comparator 16, FIG. 11 the analogue output signal S17 over time during changeover, FIG. 12 a circuit for increasing the changeover reliability, FIGS. 13, 14 the analogue output signal S17 over time across the output of the buffer B with and without zero referencing, FIG. 15 the signal V1, derived from the analogue output signal S17, over time at the window comparator according to FIG. 14 with associated LED selection, FIG. 16 a circuit according to FIG. 12 with a hysteresis detector, FIG. 17 a signal characteristic of the output signal S17 with simultaneous use of the hysteresis detector, FIGS. 18a-18c arrangements for use as a volume control, for processing a data stream or as a position display, FIG. 19 a mechanical sliding control according to prior art, FIGS. 20, 21 arc-shaped and circular regulating/adjusting units according to the invention, FIG. 22 a regulating/adjusting unit in the form of a virtual turning knob, FIG. 23 a regulating/adjusting unit with two transmitting elements, FIG. 24 a complete block diagram.

FIG. 3 shows such wiring, where the light-emitting diodes (LEDs) operate sequentially in respect of time as transmitters and receivers. In the phase $t_x$ the switch Sa, for example, is closed and connects the output of the clock generator 100 to the LED via the series resistor $R_{10}$. The clock generator is operated e.g. at a frequency of 10 kHz. In this phase the switch Sb is open and disconnects the LED from the amplifier 300. The inverter 200 is used only to invert the control signal Sts. In phase $t_y$ the switch relationship is reversed and the switch Sa disconnects the LED from the clock generator 100, while switch Sb connects the LED to the amplifier 300.

To present a display, generally at least one element of an LED row will emit light, while all of the others are switched off. Naturally, there are however also constructions where all of the display elements up to the set value are switched on, i.e. form a light strip. If the light-emitting element of the LED row emits its light, not as constant light by virtue of continuous selection, but in a pulsed manner e.g. by means of a 10 kHz rectangular-pulse signal, it nevertheless appears to the naked eye as a continuously light-emitting element. At the same time, it may however be used as a transmitting element of a sensor apparatus. Adjacent LEDs, which are correspondingly connected as receivers, may namely receive the signal of the pulse-controlled LED when a reflecting element, e.g. a finger 2, is situated above the LED that is emitting the pulsed light.

Figure 4:
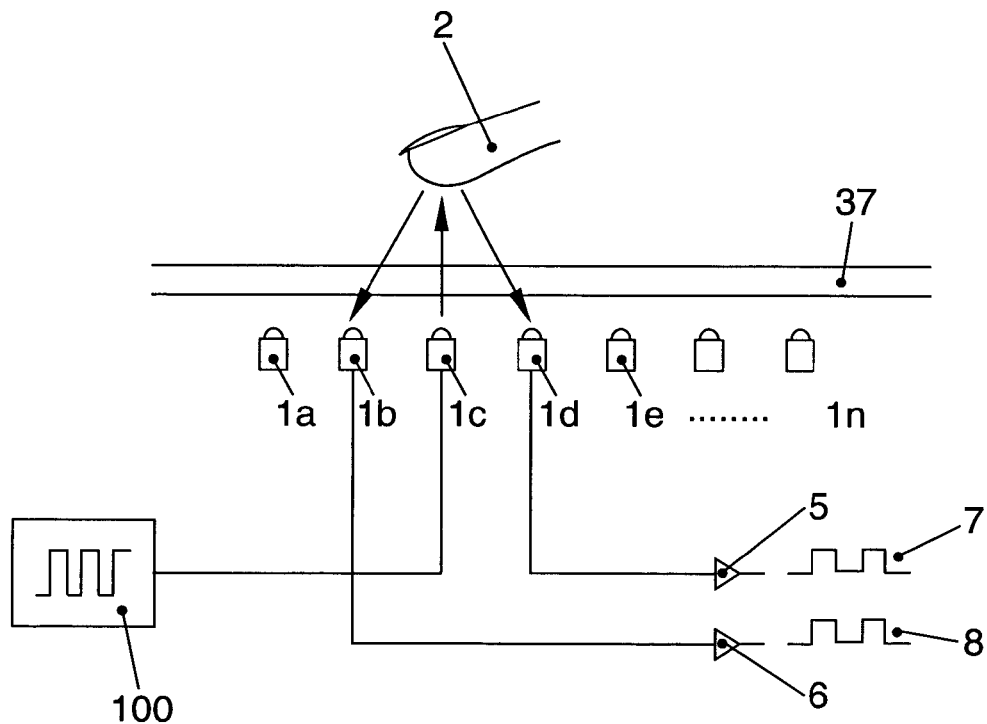

Given a positioning of the reflecting element centrally above the transmitting LED 1c according to FIG. 4, the emitted light is reflected uniformly onto the adjacent LEDs 1b and 1d. In said case, a pane 37, which is translucent with regard to the respective radiation emitted by the LED may also be situated between the LEDs and the reflecting element, e.g. a finger 2. As radiation, in particular, all optical radiation in the visible range but also in the range invisible to the human eye is suitable. Given symmetrical reflection, there is also across the outputs of the amplifiers 5 and 6 an amplitude of equal size in the output signals 7, 8.

Figure 5:
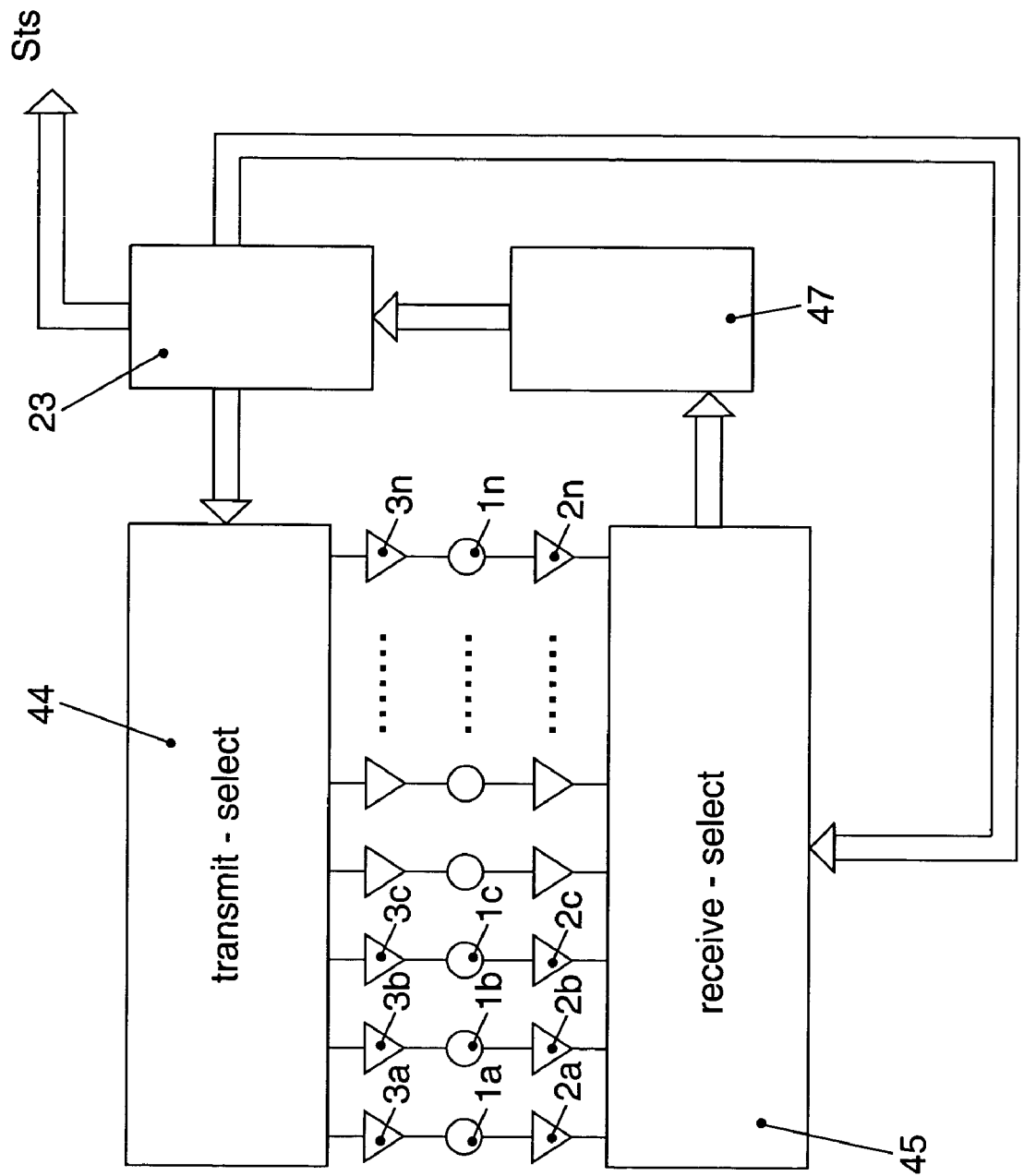

FIG. 5 shows an arrangement for realizing the sensitive LED row. The light-emitting diodes 1a . . . 1n may be utilized both in the transmitting and in the receiving range. For the transmitting mode of the light-emitting diodes 1a . . . 1n, connectable driver stages 3a . . . 3n are provided and, for the receiving range, connectable amplifiers 2a . . . 2n are provided. The signal distribution stages 44 and 45 are suitably positioned by the setting of the position counter 23. The direction decision unit 47 detects the direction of motion of the reflecting element and decides when a specific value of the position deviation has occurred. If this was the case, position counter 23 is correspondingly activated and counts one position value upwards or downwards. At the same time, the direction decision unit 47 may first of all establish whether there was "momentary contact" of the light-emitting element before reacting to movement e.g. of the finger 2, or whether it was a case of inadvertent touching of the sensor-active surface and hence no reaction of the LED display is to occur.

The position counter 23 via a control unit 24 (FIG. 7) controls both the selection of the transmitter elements and the receiving mode. In each case, therefore, a single LED is selected as a transmitter, while at least the LEDs adjacent to it—e.g. the next or next but one LED—are connected as receivers. However, it is of course also possible for two LEDs to transmit simultaneously and for the LED disposed between the two light-emitting LEDs to be connected as a receiver. In principle, it is also possible for separate receiving elements to be arranged staggered or offset relative to the LEDs, e.g. in a row parallel to the LEDs. At the position counter 23, moreover, the control signal Sts for influencing any desired regulating/adjusting unit 30 is tapped.

Figure 6:
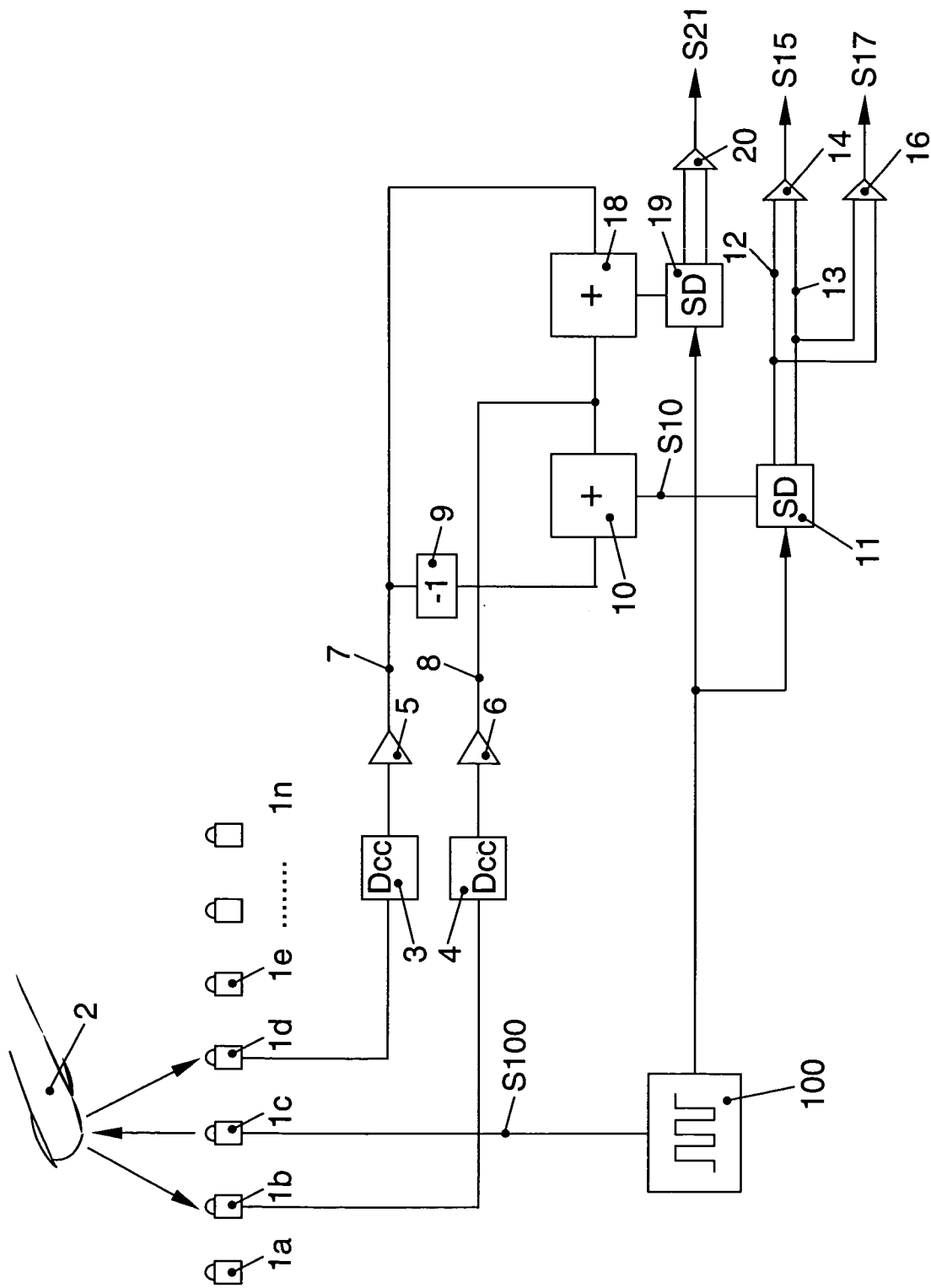

FIG. 6 shows a circuit for direction detection, momentary contact recognition and detection of the horizontal movement of the reflecting element in relation to the light-emitting LED, here LED 1c. Here, LED 1c is selected by the clock generator 100 and is emitting light, which is reflected by the finger 2. The adjacent LEDs 1b, 1d receive a reflection component caused by the finger 2. DCCs 3, 4 form an operating point adjustment for the LEDs as receivers. With the aid of these DCCs (DC compensation), even in the event of intense extraneous light the LEDs are prevented from becoming saturated. The construction of such an operating point adjustment is known e.g. from DE-PS 44 31117.

For the sake of simplicity the changeover switches of the LED selection are not shown in the drawing. Two amplifiers 5 and 6 of an identical type amplify the low output signals of the LEDs 1b and 1d adjacent to the transmitter to a value that is easy to process further. Before both output signals 7 and 8 are combined in the summing stage 10, the inverting circuit 9 inverts one of the two signals.

Given the absence of a reflecting element, such as a finger 2, or given the presence of one but with symmetrical reflection of the transmitted signal back into LEDs 1b, 1d, no signal occurs across the output of the summing stage or because of the inverting circuit 9 two signal components, which for instance arise but are of equal magnitude, cancel each other out so that there is likewise no signal across the output of the summing stage 10. Given the presence of a reflecting element and simultaneous asymmetry relative to the transmitting LED 1c, e.g. if the finger 2 has shifted slightly to the right, at the LED 1d owing to intensified reflection a greater signal develops than at the LED 1b. This leads, across the output of the summing stage 10, to a signal with a clocked modulation with corresponding sign of the phase in relation to the signal of the clock generator 100. The magnitude of the signal is determined by the horizontal position of the finger 2 in relation to the transmitting LED 1c.

The output signal of the summing stage 10 is supplied for further evaluation to a synchronous demodulator 11. The control signal for the synchronous demodulator is tapped from the clock generator 100. It corresponds substantially to the transmitted signal but takes into account the phase displacements arising in the amplifiers 5 and 6. The synchronous demodulator 11 splits the output signal of the summing stage 10 once more into two individual signals 12, 13 associated with the LED 1b and 1d respectively. For a clear decision about the direction of motion and/or position of the finger 2 relative to the transmitting element 1c, the two individual signals 12 and 13 are compared with one another in the comparator 14. The digital output signal S15 of the comparator 14 provides clear information about the position of the reflecting element, in relation to the transmitting element 1c, i.e. about whether the finger 2 is situated to the right or left of the centre of the LED 1c.

In order to decide, from which position variation an advancing of the light-emitting LED analogous to the movement of the finger 2 is to occur, the output signals 12 and 13 of the synchronous demodulator 11 are compared in a suitably analogue-operating comparator 16, e.g. with an operational amplifier. The analogue output signal S17 corresponds to the horizontal deviation of the finger from the centre of the transmitting LED 1c. From this output signal during further signal processing the switching signal for the position counter 23 (FIG. 7) is obtained. The digital output signal S15 is used to define the appropriate counting direction for the position counter 23. In the embodiment, a counting direction towards higher values may advance the transmission driver from the LED 1c to the LED 1d, with a simultaneous changeover of the amplifiers 5 and 6 from LED 1b and 1d to 1c and 1e.

To prevent unintended adjustment owing to inadvertent contact, prior "momentary contact" of the light-emitting element for further activation of the adjustment facility may be provided. For this purpose, information has to be obtained from the vertical movement of the finger 2 towards or away, respectively, from the light-emitting element. This information may be gathered from the summing stage 18, in which both signals of the receiving LEDs are summed. A synchronous demodulator 19 correspondingly evaluates the summed signal and said signal is available via the buffer stages 20 as an analogue distance signal S21.

Figure 7:
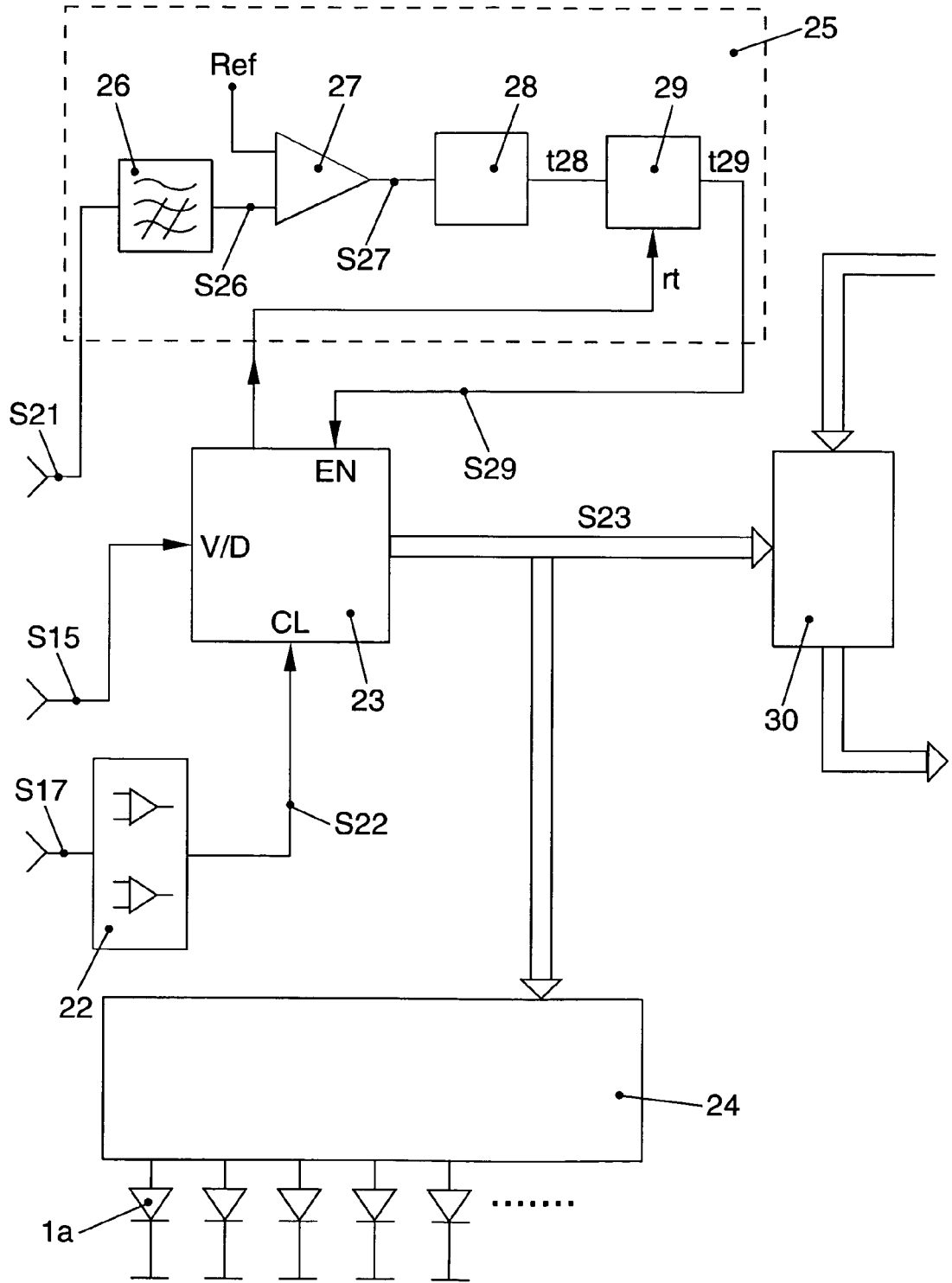

FIG. 7 shows the evaluation of the signals S21, S15 and S17. A window comparator 22 supplies an output signal S22 when the output signal S17, which is in fact an analogue value of the horizontal position of the finger in relation to the transmitting LED, exceeds or falls below a value preselected in the window comparator 22. This value is reached when the reflective element, i.e. the finger 2, is moved some distance laterally of the centre of the transmitting element (LED 1c) towards the adjacent receiving element (LED 1b or 1d), even if the distance is less than half the distance between two adjacent elements. The output signal S22 of the window comparator 22 is supplied as a clock signal to the position counter 23.

The decision, whether the position counter 23 is to count upwards or downwards, which corresponds to a "shift" of the light-emitting LED to the left or to the right, is taken from the output signal S15 of the comparator 14. The output signal S23 of the position counter 23 is supplied to the control unit 24. The control unit 24 determines the position—corresponding to the numerical value of the output signal S23—of the transmitting LED and its at least two indirectly or directly adjacent receiving LEDs or receiving elements.

In principle, the light-emitting LED is not to change position simply as a result of a hand being inadvertently wiped over the LED. Rather, first the position sensitivity is to be activated manually before the light-emitting LED "travels along" with the moving finger. For this purpose, the output signals 7, 8 are combined in the summing stage 18 and synchronously demodulated and the distance signal S21 thus obtained is conditioned in a suitable evaluation circuit 25 in such a way that e.g. a shift of position is enabled only after "momentary contact" with the light-emitting LED has been effected once or twice.

The momentary-contact recognition apparatus preferably recognizes as momentary contact a pattern of motion, which comprises the approach of a body, the sudden braking of the body against a touched surface and a dwelling on the surface for a preselected time t28.

Figure 8A:
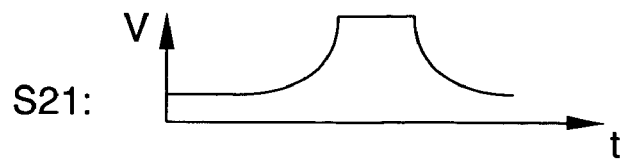
Figure 8B:
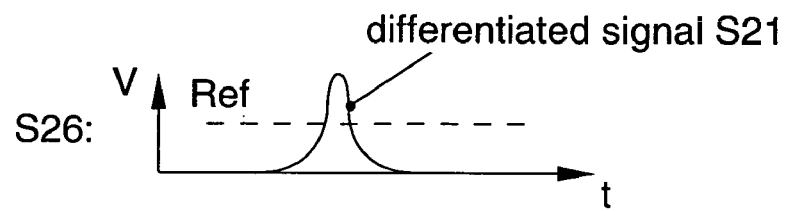
Figure 8C:
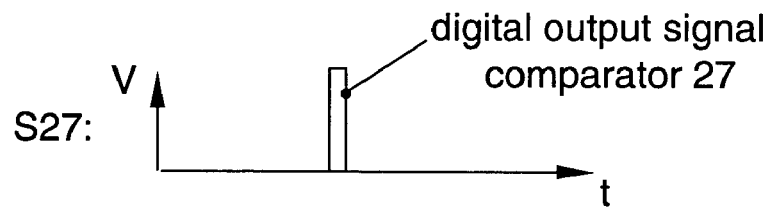
Figure 8D:
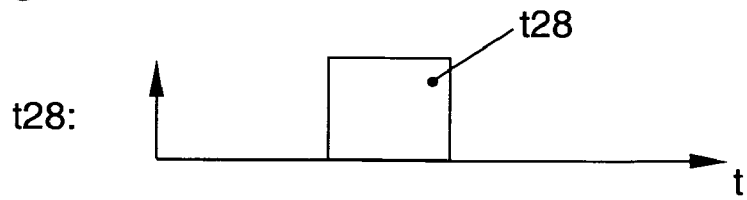
Figure 8E:
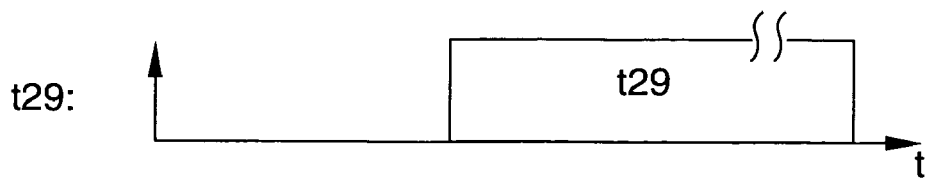

To this end, in the embodiment the distance signal S21 is passed through the high-pass filter 26, which allows through only the higher-frequency spectral components of the distance signal S21. These signal components occur only in the event of a rapid variation in the distance signal S21 according to FIG. 8a. The sudden braking of the finger on a translucent surface above the LED row may therefore lead to an output signal S26, a signal differentiated from the distance signal S21. If this output signal S26 according to FIG. 8b exceeds a predetermined value Ref, the comparator 27 supplies a digital output signal S27 (FIG. 8c) to a first timer 28 with a timer time t28 of several hundred milliseconds to seconds (FIG. 8d). At the end of this short time, timer 29 according to FIG. 8e is started. Its running time is several seconds. The output signal S29 enables the position counter 23. A variation of the counter content then retriggers (rt) the timer 29. If the position of the light-emitting LED is not varied within the running time t29 of the timer 29, the time t29 elapses and the position counter 23 is disabled again. This circuit arrangement prevents the position of the light-emitting LED in the LED row from being varied by an unintentional movement. It is only after "momentary contact" that the position of the light-emitting LED may be shifted by renewed contact with the light-emitting LED and displacement of the finger.

At this point any conceivable circuit arrangement may be inserted, i.e. including counter arrangements, which also enable the position counter 23 only after repeated momentary contact with the light-emitting LED. From WO 01/54277 A1 an arrangement—which is e.g. preferentially usable here—is known, in which a function is switched only if a finger quickly touches (has momentary contact with) the translucent surface above an LED and remains relatively still there for at least a specific time, e.g. 200 ms.

The digital output signal S23 of the position counter 23 moreover controls the control unit 24. In the control unit 24, the transmitted drive signal is suitably distributed to the LEDs and the two amplifier inputs of the amplifiers 5, 6 (FIG. 6) are distributed to the LEDs adjacent to the transmitting diodes. The output signal S23 of the position counter 23 (FIG. 7) may further be used to control any desired value controller of a regulating/adjusting unit 30, e.g. for volume control.

If the light-emitting LED is "shifted" into one of the two end positions, it is however no longer possible for the at least two adjacent LEDs to serve as receivers, but only one. In said case, in the event of parasitic reflections e.g. at the translucent surface, the single receiving LED, e.g. LED 1a, receives a signal similar to that of a "shifted" finger. In extreme cases, this unwanted signal would lead to the selection repeatedly skipping back from LED 1a to LED 1b.

Figure 9:
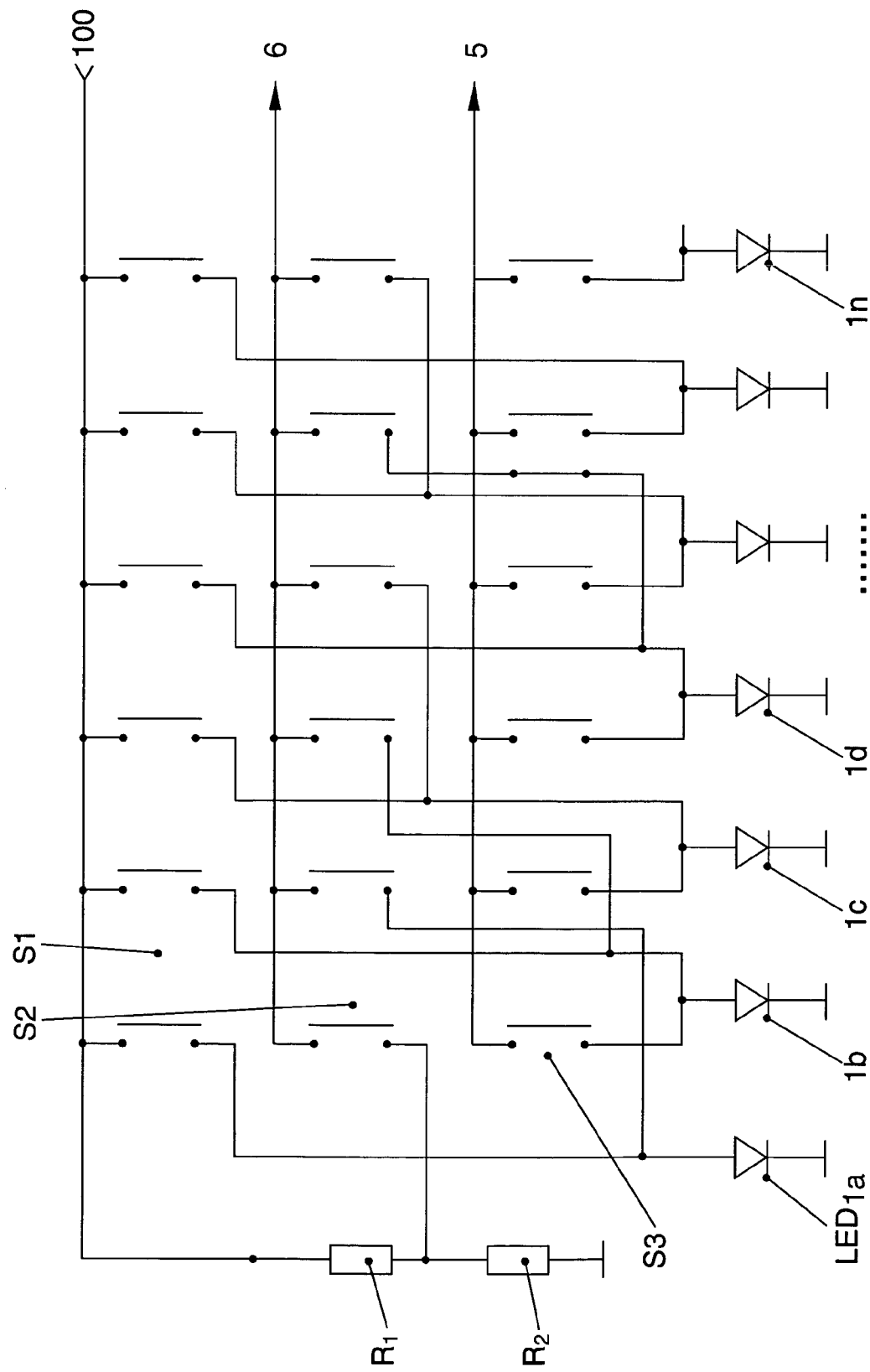

To prevent this, upon selection of LED 1a a simulated "light signal" is presented to the amplifier 6 (FIG. 6). FIG. 9 shows the corresponding changeover in said respect. Switches S1, S2 and S3 are activated via the control unit 24 by the control signal S23 of the position counter 23 (FIG. 7). Switch S1 connects the output of the clock generator 100 to the appropriate LED. In the embodiment, in FIG. 9 to the LED 1a, i.e. out on the far left. Switch S3 connects the amplifier input of the amplifier 5 to the LED 1b lying adjacent on the right. Switch S2 connects the amplifier input of the amplifier 6 to a voltage divider $R_1/R_2$, which is connected to the output of the clock generator 100. The divider ratio of the voltage divider $R_1/R_2$ is so dimensioned that the magnitude of the divided-down transmitted clock signal is slightly greater than the received signal of LED 1b produced by parasitic reflection at the translucent surface.

It is thereby guaranteed that, when the finger is moved over the LED row, e.g. from the middle to the left over LED 1a, the latter as the last LED in the row emits light. If, on the other hand, the finger is moved from the side across the light-emitting LED 1a towards the middle of the LED row, then in the position of the finger 2 between LED 1a and 1b the reflection of the transmitting LED 1a at the finger will produce a greater signal than was supplied by the voltage divider $R_1/R_2$. The phase angle of the signal S10 (FIG. 6) is therefore reversed and the selection of LED 1a switches over to LED 1b, and/or follows the finger 2.

With the previously described arrangement for controlling the LED row the light may of course be shifted by the finger only in one direction in each case. The reason for this is that, from a specific distance—determined by the threshold values defined in the window comparator 22 (FIG. 7)—of the finger from the centre of the actually light-emitting LED, the light shifts in front of the moving finger 2. If by virtue of continuous finger movement the actually light-emitting LED is passed over again, the light switches in front of the finger to the next LED and so on. If, however, after a shift the finger 2 stops and is moved back, the last light-emitting LED remains in its last position. To reverse the direction of motion, the finger then has to be placed—viewed in the direction of motion—in front of the light-emitting LED. It has to be passed over in the, then, reverse direction of motion. The display then follows the finger position once more.

However, as this is impractical in general use, between the comparator 16 (FIG. 6) and the window comparator 22 (FIG. 7) a circuit is inserted, which ensures that the light spot always directly follows the finger movement. This circuit arrangement utilizes the effect whereby during the changeover from one LED to the next LED the polarity of the counter control signal (output signal S15) and of the analogue output voltage of the comparator 16 (output signal S17) is reversed. This is easy to explain if one considers that the changeover occurs when the finger moves e.g. to the right away from the light-emitting LED and the LED situated on the right of this LED detects an increased reflection. If this value exceeds a predetermined quantity, then the window comparator 22 supplies a corresponding signal and the position counter 23 (FIG. 7) counts one value "upwards", in this case therefore to the "right". The originally light-emitting LED "shifts" from the, relative to the finger 2, left position to the position on the right of the finger. The LED originally connected as a light-emitting element changes its function and becomes the opto-receiver, which is however now situated on the left of the transmitting element. However, as the finger 2 is still situated in an approximately identical position, the LED situated on the left of the transmitting element then receives more reflection than the LED situated on the right of the transmitting element. This however means, across the output of the summing stage 10

(FIG. 6), a reversal of the phase and hence also a reversal of the polarity of the digital output signal S15 and also of the analogue output signal S17.

Figure 10:
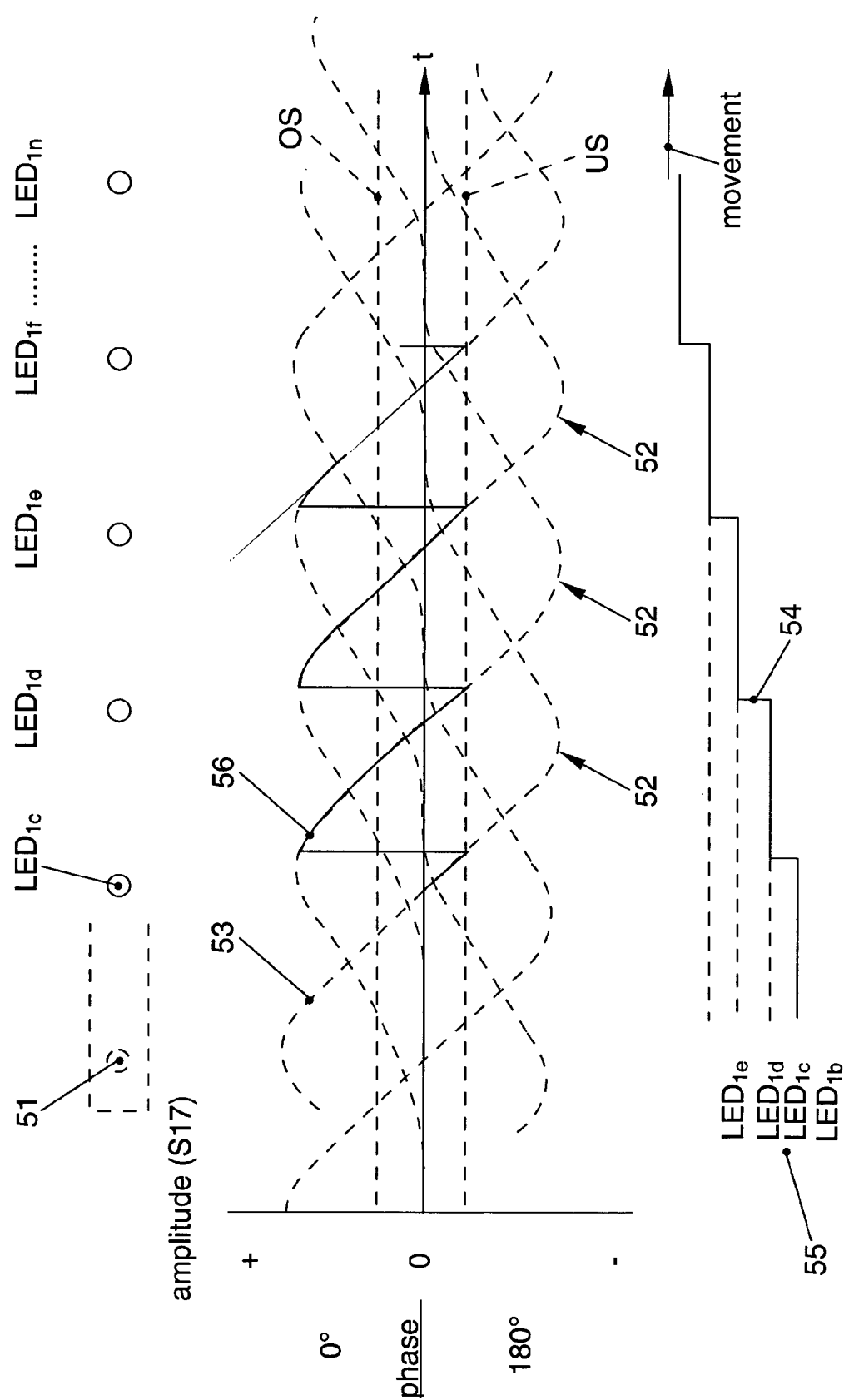

FIG. 10 describes the phases and amplitude relationship of the analogue output signal S17 (FIG. 6) of the comparator 16 in such a case. Position 51 or LED 1a ... 1n, respectively, show the mechanical arrangement of the LEDs, 52 the associated signal values of the analogue output signal S17 of the comparator 16. 53 corresponds in the illustrated case to a signal, when LED 1c is emitting light. If during a finger movement to the right the output signal S17 of the comparator 16 falls below the preselected lower threshold value US, the position counter 23 counts one counter upwards (54 in FIG. 10). The counter setting determines which LED is selected in switching mode (55 FIG. 10). The solid bold line 56 shows the characteristic of the output signal S17 of the comparator 16 when a finger 2 is moved from left to right over the LED row.

In the changeover situation, the threshold value OS of the window comparator 22 is again—in a different polarity—exceeded and so the position counter 23 will count back again. A continuous changeover of the LED positions symmetrically relative to the finger 2 would be the result. The light-emitting LEDs follow the finger 2 in that, when the finger is positioned centrally on an LED, only this LED emits light, whereas, when the finger is positioned between two LEDs, both emit light in rapid alternation.

For tolerances reasons, however, after a first overshooting of the threshold value US a changeover may be effected, after which the threshold value OS is in turn overshot and a second changeover is effected back to the original position, only this time the threshold value US is not undershot so that a further changeover is not absolutely guaranteed. Upon movement of the finger over the LED row the display may consequently "become stuck".

Figure 11:
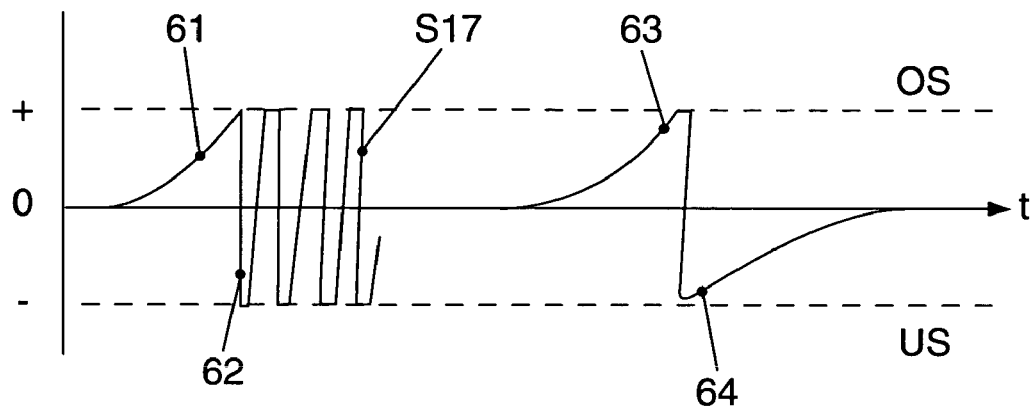

FIG. 11 shows the analogue output signal S17 (FIG. 6) of the position recognition comparator 16. In section 61 the finger 2 moves from the centre of the transmitting LED e.g. to the right, the analogue output signal S17 of the comparator 16 correspondingly increases. When it hits the upper threshold value OS, the LED selection advances to the next LED on the right. The sign of the output signal therefore reverses (62) and the signal reaches the lower threshold value US. The LED selection switches back to the previous LED. Naturally, there is also a corresponding changeover of the LEDs connected as receivers.

Undesirable tolerances, e.g. as a result of a scratch on the translucent surface, may lead to the situation where the LED does in fact "shift", because the upper threshold value OS was reached without difficulty (63, FIG. 11), but afterwards the lower threshold value US after the change of sign is no longer undershot (64, FIG. 11). If the operator in this situation reverses the direction of the finger movement because e.g. the operator wishes to move back from this adjusted value, the display does not respond and, despite movement of the finger, remains in position. This maloperation may easily be prevented in that after each change of LED the output signal S17 is utilized in its entire magnitude from zero. Previously, it had to run through the voltage range from the upper threshold value OS, through zero to the lower threshold value US. Upon a second switching operation back to the original position there was a factor of uncertainty about reattainment of the lower threshold value US. If, however, the instantaneous output signal S17 of the comparator 16 is referred to "0" at the changeover moment, the Δ of the signal starts at zero and therefore exceeds the respective threshold value with double amplitude, which guarantees unconditional switching reliability.

Figure 12:
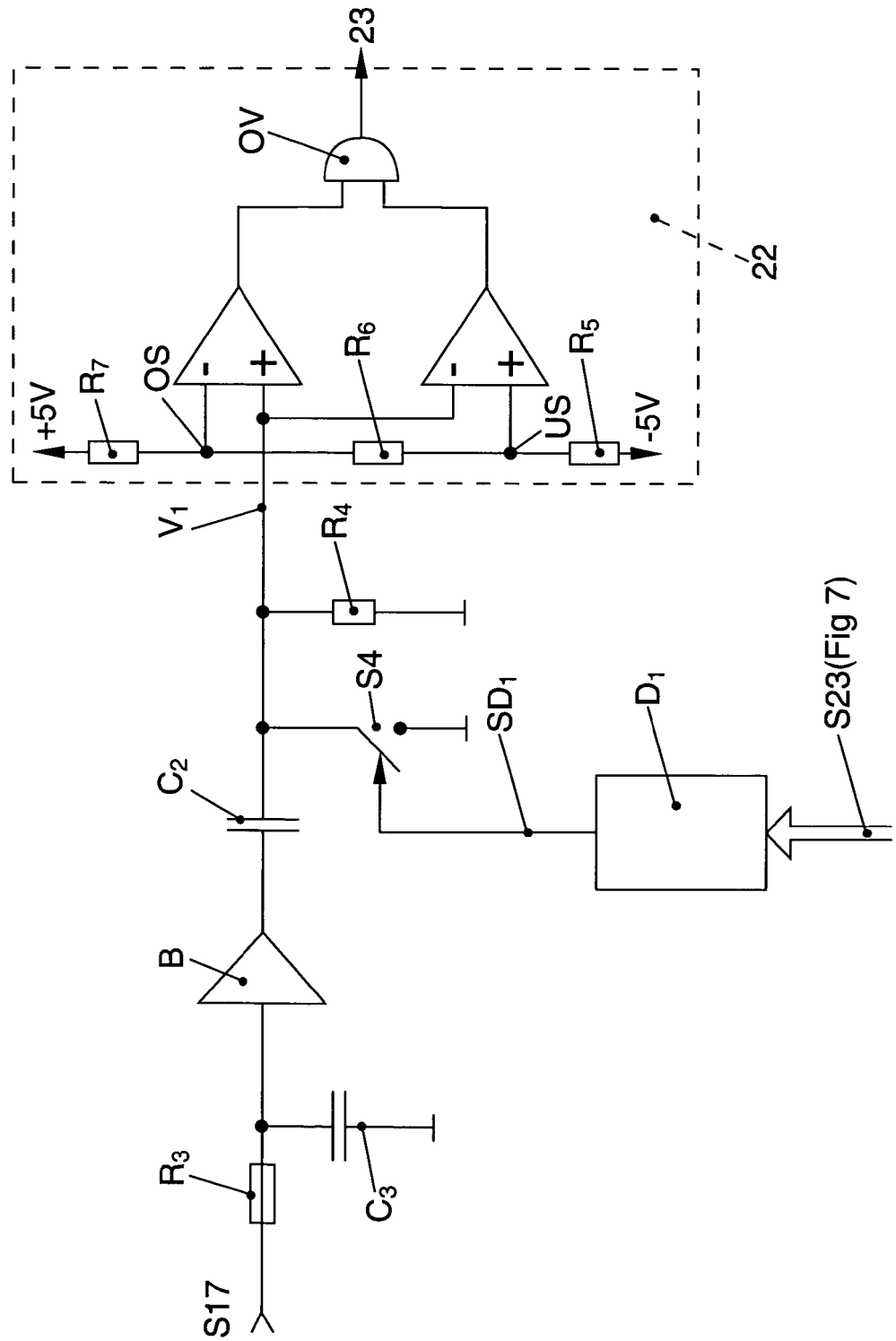

In FIG. 12 a low pass constructed from $R_3$ and $C_3$ forms a time delay for the signal S17 of the comparator 16. Capacitor $C_2$ together with switch S4 forms a referencing unit. Buffer B is used only to electrically isolate the referencing unit $C_2$/S4 from the low pass $R_3$/$C_3$. D1 is a differentiating apparatus for a counting signal of the position counter 23. Each time the numerical value S23 of the position counter 23 changes, a short pulse is applied via a signal line SD1 to switch S4 and, when switch S4 is closed, the capacitor $C_2$ is discharged to zero. The output signal S17 of the comparator 16 because of the delaying low-pass effect of the low pass $R_3$/$C_3$ at the output of the buffer B during the switching time of switch S4 has experienced only an insubstantial change, so that virtually the entire Δ of the output signal S17 may come into effect across the input of the window comparator 22. Naturally, zero is only one example of a preselected or preselectable value. Referencing may be effected also to another specific preselected or preselectable value, so that after the changeover the next threshold value US or OS is reached with part of the output signal S17.

With the circuit according to FIG. 12 it is guaranteed that each finger movement is easily detected and the light-emitting LED always follows the finger movement. In said case, only one LED emits light when the finger is situated centrally on it, and two adjacent LEDs when the finger is situated between them. In the latter case, the position of the light-emitting LED alternates at a frequency determined by the low pass $R_3$/$C_3$. Given suitable dimensioning, the frequency may be higher than is detectable with the eye, so that a continuous emission of light is perceived. Analogously to the finger position between the two LEDs, there is a corresponding distribution of the intensity of the luminosity. In the embodiment, $R_3$ has 10 kΩ, $R_4$ 1 MΩ, $R_5$ 10 kΩ, $R_6$ 1 kΩ and $R_7$ 10 kΩ. $C_2$ has a value of 0.1 μF and $C_3$ a value of 10 nF.

Figure 13:
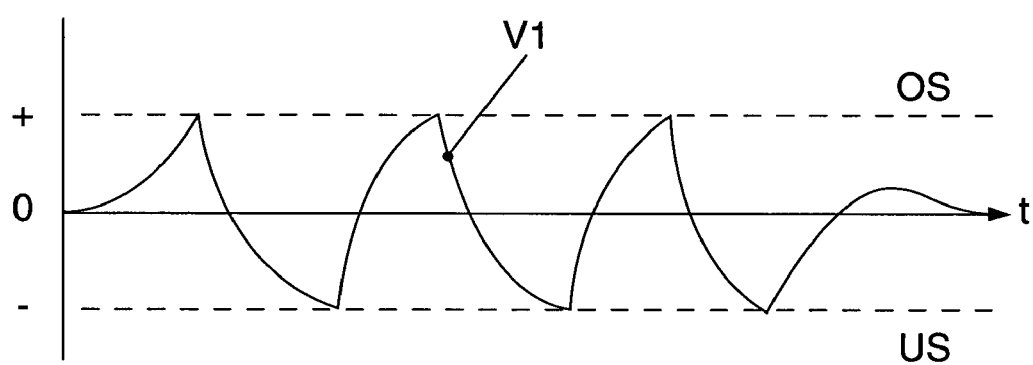
Figure 14:
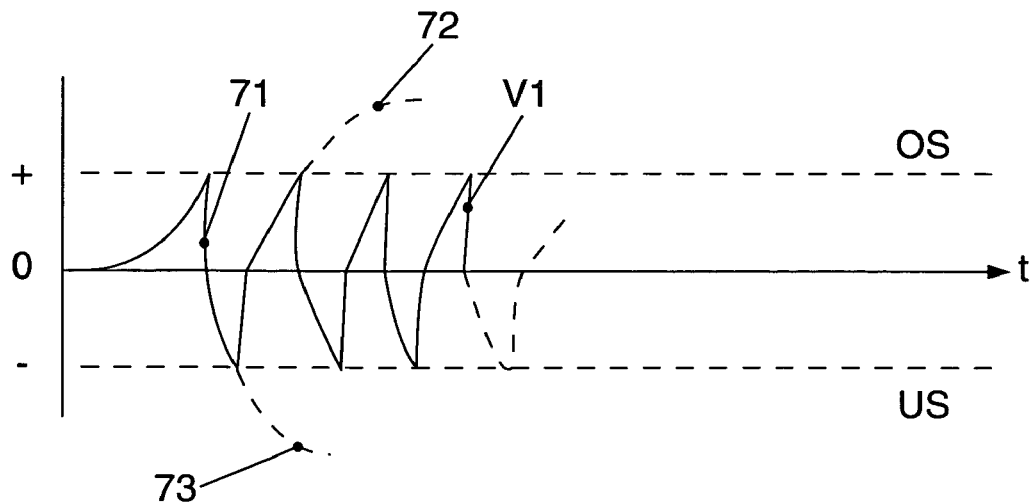

FIG. 13 shows the analogue output signal S17 across the output of the buffer B (FIG. 12) when a finger is moved over the LED row without switch S4 being actuated. FIG. 14 shows the same analogue output signal S17 only across the input of the window comparator 22, when the switch S4 upon each change of position refers the signal S17 to zero (71 in FIG. 14). The dashed lines 72, 73 correspond to the signal if no further changeover were to occur. It is clear that the output signal S17 after referencing 71 would definitely exceed the threshold value OS or US, respectively, and therefore leads to a trouble-free switching operation. The steep flank arises during the referencing 71 when switch S4 for a short time during the position switching operation discharges the capacitor to "0". To prevent the input voltage of the window comparator 22 from "drifting away" on account of the open switch S4, a high-value resistor R4 is connected in parallel to the switch S4. The d.c. decoupling by means of capacitor $C_2$ and resistor $R_4$ additionally also prevents the influence of disturbances, e.g. an asymmetry across the output of the comparator 16 owing to scratches on the translucent surface. The disturbance-induced signal deviation from zero, when the finger has been removed, is automatically referenced to zero after the capacitor $C_2$.

Figure 15:
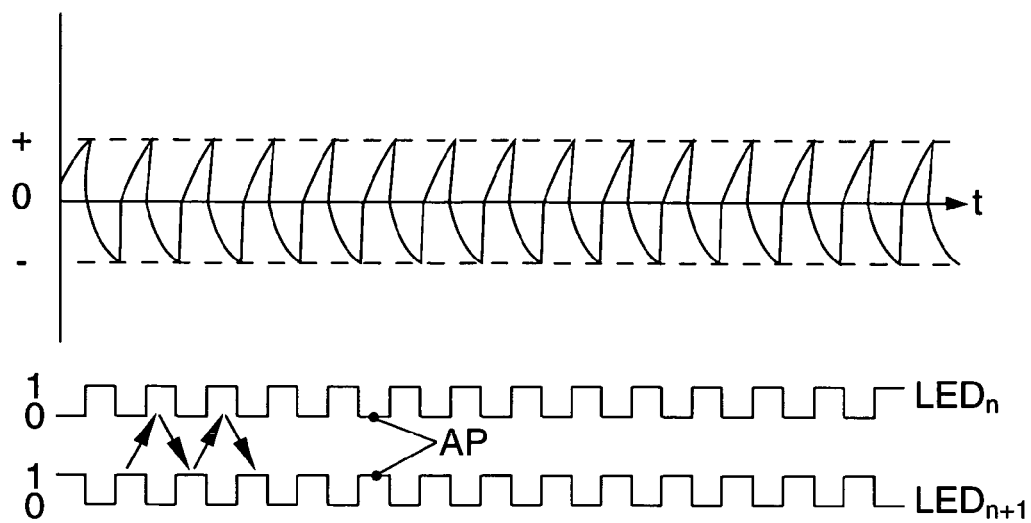

Often, however, given a finger position between 2 adjacent LEDs, for easier selection only one of the two LEDs should emit light. And namely the one that is nearest to the controlling finger. In the previously described embodiment both LEDs emit light alternately, according to the construction so quickly that to the eye it appears like a continuous emission of light. FIG. 15 shows the signal V1, which is derived from the output signal S17, across the input of the window comparator 22 in FIG. 12 when the finger 2 is situated between two LEDs. AP shows the activation phases of the two LEDs n and n+1.

Figure 16:
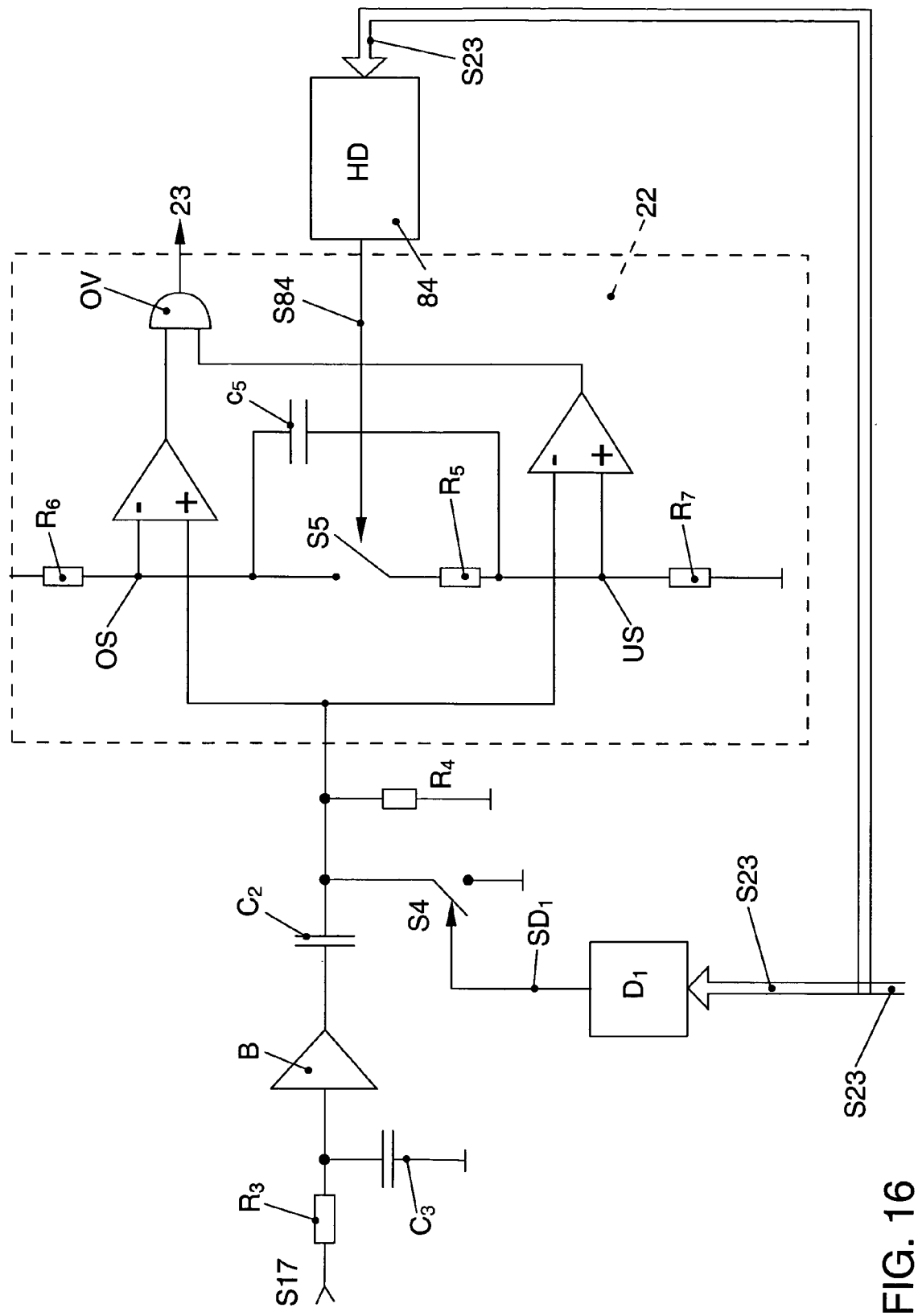

In order in this situation to be able to opt for one of the two LEDs, by means of a hysteresis detector 84 (FIG. 16) as a decision aid a control signal S84 is produced for the two threshold values OS and US. The hysteresis detector 84 checks the count value of the position counter 23 (FIG. 7) for periodic counting operations with maximum counting increments +/−1. If such a switching sequence appears in the count value S23 for a number of periods (e.g. greater than 5) within a predetermined time, the hysteresis detector 84 opens the switch S5. This is always the case when a finger is situated between two adjacent LEDs. If switch S5 opens, the capacitor $C_5$ charges up from the threshold value preselected by the voltage divider $R_5$, $R_6$, $R_7$, i.e. towards a higher potential. In said case, the upper threshold value rises, while the lower threshold value drops.

The control device 24 therefore switches back and forth between adjacent light-emitting diodes, if the finger 2 remains between adjacent LEDs without changing, and increases the sensitivity for position recognition until a preselected value is exceeded. Thus, in the event of repeated switching back and forth a decision aid is activated, which sets the receiving element less and less sensitively until the light-emitting diode situated closer to the body may be clearly determined. The decision aid then reverts to the state of sensitivity for the detection of further movement of the finger 2.

Figure 17:
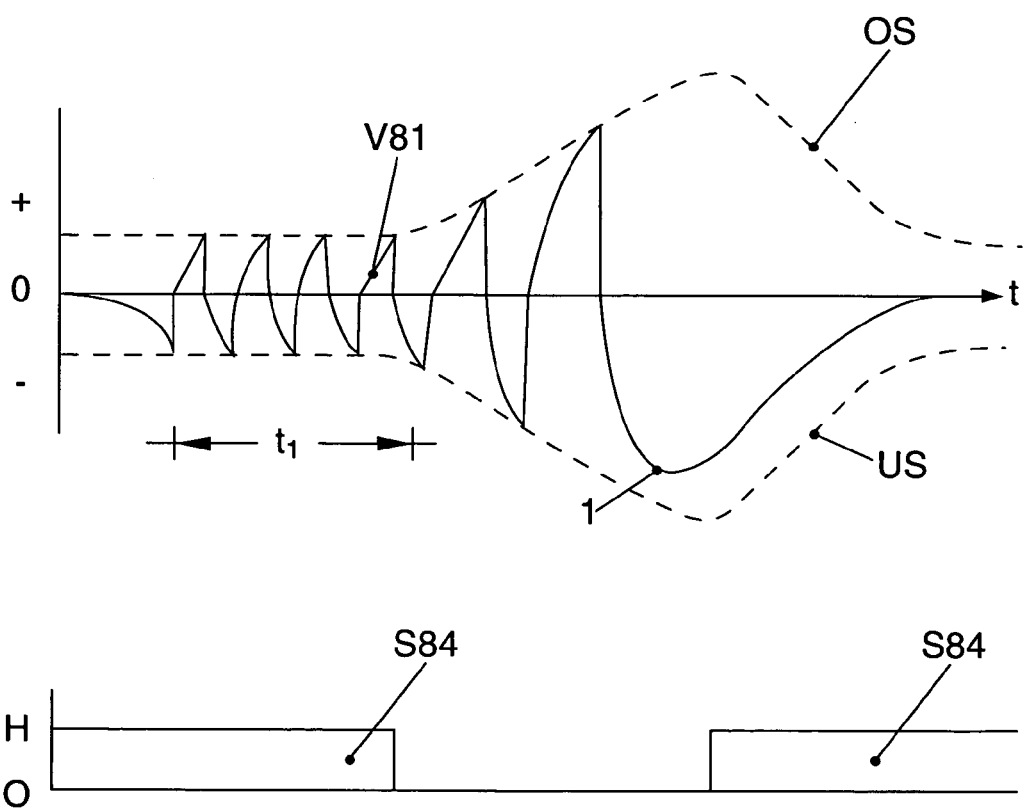

FIG. 17 shows the variation of the threshold value OS and US. In the period $t_1$ the hysteresis detector 84 has identified at least five switching operations between two adjacent LEDs and has set the control signal S84 to "low" so that the switch S5 has been opened. This state lasts until the signal V1 no longer exceeds the threshold values (81 FIG. 17) and only one LED emits light. This is registered by the hysteresis detector 84 and it closes switch S5 again. The time constant of the capacitor $C_3$ and of the resistor $R_5$ is to be so dimensioned that it is greater than the time constant of $C_2$ and $R_4$ in order to guarantee trouble-free referencing of the signal V1. The circuit arrangement has then reattained its original sensitivity for the detection of finger movement. The changeover of the threshold values OS and US may be effected so quickly that a simultaneous emission of light by two LEDs occurs for only such a short time during the finger movement that it is not perceived by the eye.

For improved comfort a circuit may be additionally inserted, which is not more closely designated here and which in the event of an inadvertent displacement of the finger 2 during removal results in no shift of position of the LEDs and hence of the desired control value. For this purpose, the distance signal S21 is evaluated. If this indicates a removal of the finger with a simultaneous change of position, then this change of position is accordingly ignored, e.g. by disabling the position counter 23. Preferably, a value of the deviation from the last signal of e.g. 10% may also be preselected. If this value is exceeded during removal of the body, the control device 24 selects the LED, at which the body last dwelt for longer than a preselected dwell time, e.g. t28.

Figure 18A:
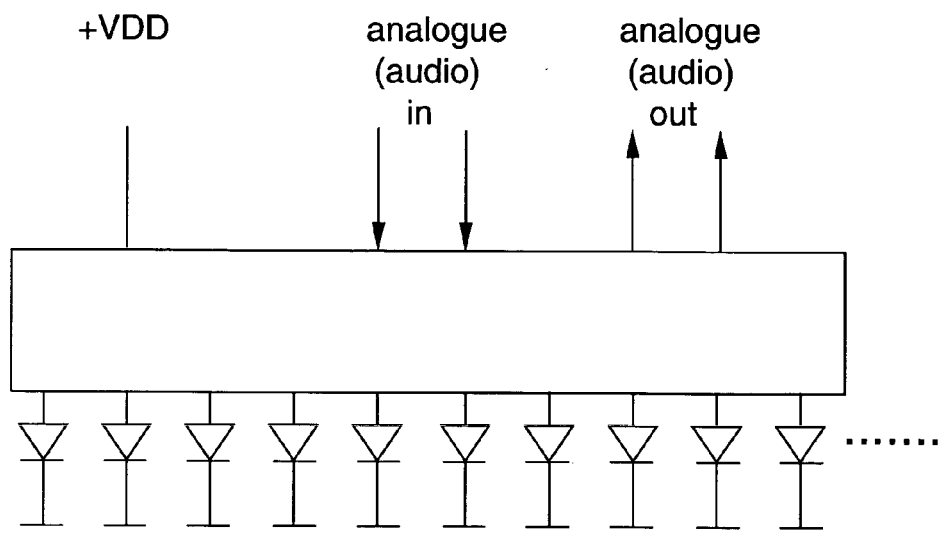
Figure 18B:
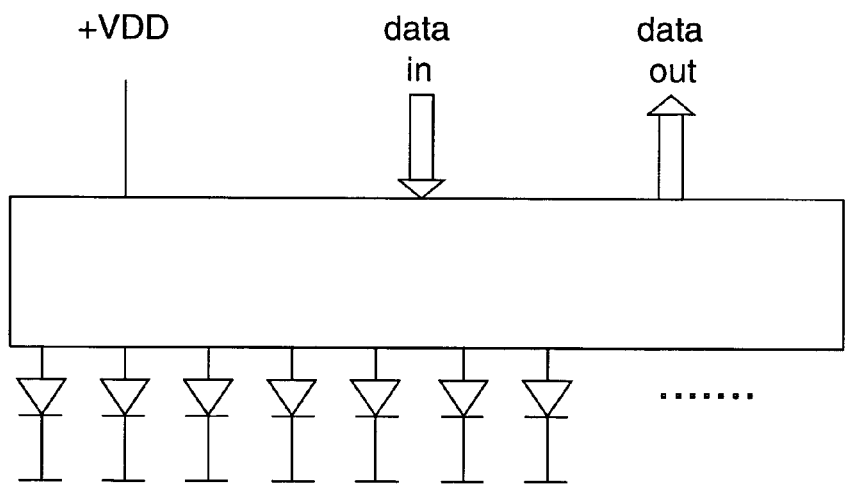
Figure 18C:
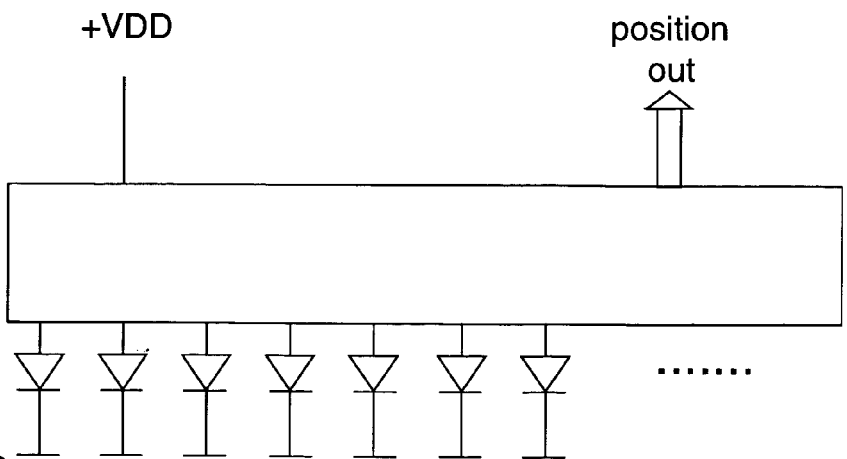

Despite the seemingly comprehensive signal evaluation, a touch-sensitive LED row in the form of an IC (integrated circuit) with external LEDs is perfectly easy to realize. Such an arrangement may be used for example, directly as a "volume control", to process a digital data stream or alternatively only to output the "position" (FIG. 18a, b, c).

Figure 22:
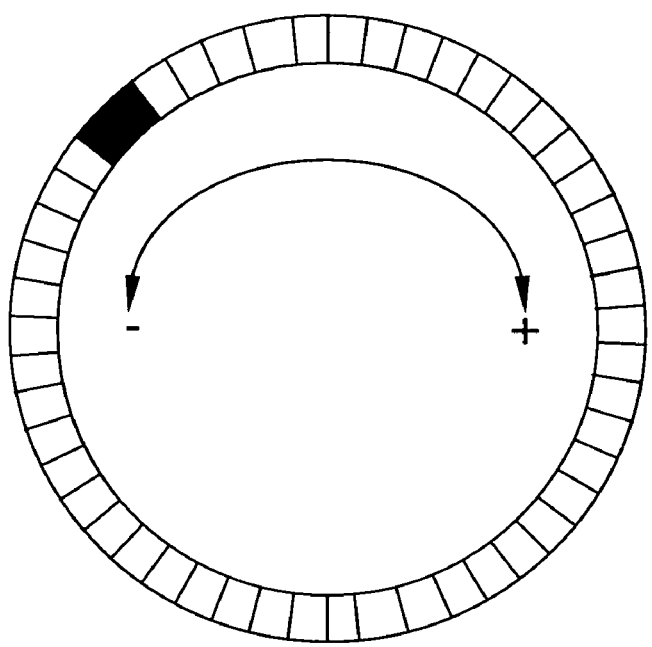
Figure 23:
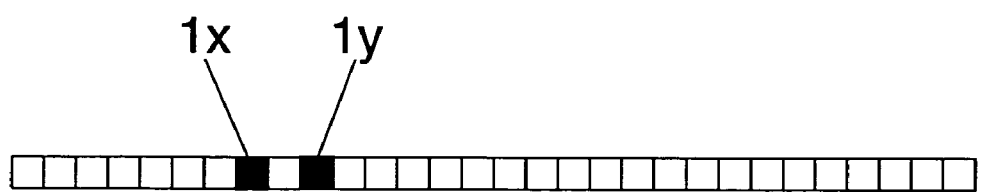

Measures may also be taken so that after disconnection of the power supply the actual counter content of the position counter 23 is retained until it is activated again. Unlike mechanical sliding controls (FIG. 19), which generally comprise a straight sliding region from a point A to a point B, the touch-sensitive LED row may be realized in any desired form of presentation, e.g. arc-shaped or round (FIG. 20/FIG. 21). To lengthen the operating path, LED rows may also be cascaded. Accordingly, if the function of a last LED in a row is functionally linked to a first LED of the same row, a virtual turning knob may easily be produced (FIG. 22).

The regulating/adjusting unit 30 will generally comprise only one display, i.e. only one light-emitting element. Naturally, however, the principle—1 transmitter, 2 receivers grouped at a small or large, uniform or non-uniform distance around the transmitter—may also be transposed. In said case, two transmitters alternately transmit and one receiver disposed midway between the two transmitters evaluates the reflected signal. Such a circuit arrangement, but without the variation of position required for the touch-sensitive LED row, is described in the earlier German patent application 101 33 823.6. By virtue of automatic correction of the received signal to zero, in the above-mentioned circuit arrangement potentially disturbing extraneous light influences are totally avoided.

Figure 24:
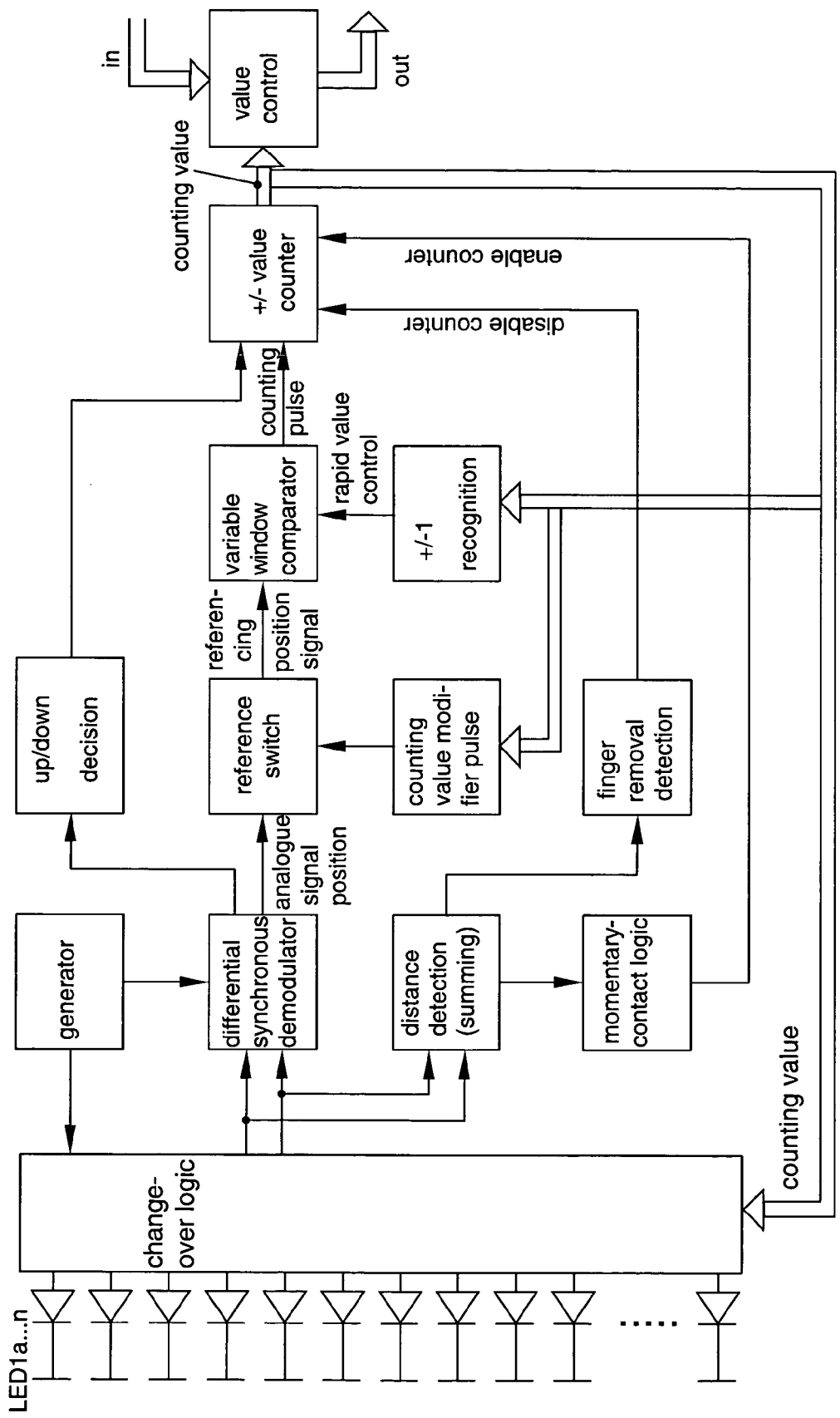

In an arrangement with 2 transmitting elements, the finger is positioned in the "gap" between the two transmitting elements and then shifted by moving the finger into the desired position. Naturally, here too, a "momentary contact" with the "gap" may initially activate a further shift facility (FIG. 24).

FIG. 25 shows a complete block diagram of the "touch-sensitive LED row".

Occasionally, a rapid change of the selected setting of the regulating/adjusting unit may also be desirable. Up until now, what has mostly been mentioned is a momentary contact with the light-emitting LED or the gap. It is however also possible for the entire LED row, after adjustment has been effected, i.e. when, for example, removal of the actuating body has been recognized, to be activated at regular intervals, e.g. at a frequency not visible to the human eye, in order to check whether and where a body is approaching or where there is momentary contact, and there e.g. after momentary contact to take over the LED as a display and also correspondingly activate the regulating/adjusting unit.

It is self-evident that this description may be subject to a wide range of modifications, alterations and adaptations, which are in the range of equivalents to the appended claims.

The invention claimed is:

1. Circuit with an optoelectronic display unit for the discrete display of the setting of a regulating/adjusting unit comprising:
   at least one detection element configured to detect actuation of the regulating/adjusting unit by means of a body configured to change the setting of the regulating/adjusting unit, wherein the detection element upon actuation is configured to supply an output signal corresponding to the desired change;
   a plurality of light-emitting diodes disposed substantially side by side in a row and configured to emit optical radiation, the light-emitting diodes being formed as display elements on the display unit;
   a control device, which, in dependence upon the output signal produced by the detection element, is configured to control at least one of the light-emitting diodes to display the respective setting, as well as the regulating/adjusting unit to change the setting, wherein the control device is configured to control at least one of the light-emitting diodes, the detection elements, as well as the regulating/adjusting unit to follow the movement of the body on the basis of the output signal, which is formed in dependence upon the movement of the body relative to the light-emitting diode that is emitting optical radiation, and that either of at least two receiving elements are provided, which are configured to be sensitive to the optical radiation of the light-emitting diodes, wherein the detection elements detect the optical radiation emitted by at least one light-emitting diode and reflected by the body, or at least one receiving element is provided, which is configured to be sensitive to the optical radiation of the light-emitting diodes, wherein the detection element detects the optical radiation emitted by at least two light-emitting diodes and reflected by the body, wherein in both cases the control device, as soon as the control device because of the output signal advances the display unit in one direction to one of the next light-emitting diodes, is configured to advances in the same direction the receiving element(s) being adjacent to the light-emitting diode emitting the optical radiation.

2. Circuit according to claim 1, wherein the one direction is along the row of light-emitting diodes.

3. Circuit according to claim 1, wherein the receiving element is one of the light-emitting diodes, which is at least part of the time controlled in such a way that upon illumination it generates a voltage.

4. Circuit according to claim 1, wherein the light-emitting diodes are configured to be operated sequentially in respect of time as transmitter and receiving element.

5. Circuit according to claim 1, wherein the light-emitting diodes immediately adjacent to the light-emitting diode that is emitting optical radiation are operated as a receiving element, and that, as soon as the control device because of the output signal advances the display unit to the next light-emitting diode, the adjacent light-emitting diodes operated as a receiving element are also configured to be advanced in the same direction.

6. Circuit according to claim 1, wherein the optical radiation emitted by the light-emitting diode is modulated by a clock generator, and connected downstream of the receiving elements is a synchronous demodulator configured to recognize the modulated light reflected by the body.

7. Circuit according to claim 1, wherein a momentary contact recognition apparatus with a surface in the vicinity of the light-emitting diode is provided, which is configured to activate a timer, which is configured to enable the actuation of the display unit.

8. Circuit according to claim 7, wherein the light-emitting diodes and the receiving elements form at least two reflection sections and that, for recognition of the momentary contact, the individual signals resulting therefrom are supplied to a summing stage to form a signal of the distance from the surface of or in the vicinity of the surface of the light-emitting diode.

9. Circuit according to claim 7, wherein the momentary-contact recognition apparatus is configured to recognize as momentary contact a pattern of motion, which comprises the approach of the body, the sudden braking of the body against a momentarily touched surface as well as a dwelling on the surface for a pre-selected time.

10. Circuit according to one of claim 7, wherein the momentary-contact recognition apparatus is configured to recognize as momentary contact only a repeated momentary contact.

11. Circuit according to claim 1, wherein the light-emitting diodes and the receiving elements form at least two reflection sections, and a comparator compares individual signals resulting therefrom in order to decide about the direction of motion in order to generate a digital output signal.

12. Circuit according to claim 1, wherein the light-emitting diodes and the receiving elements form at least two reflection sections, and a position recognition comparator compares individual signals resulting therefrom in order to decide about the changeover instant between two adjacent light-emitting diodes together with formation of an analogue output signal for the position of the object.

13. Circuit according to claim 1, wherein, for a light-emitting diode located at the end of the row, a simulation circuit is configured to simulate a light signal at the side remote from the light-emitting diode, which is adjacent to the light-emitting diode located at the end of the row.

14. Circuit according to claim 13, wherein at the simulation circuit a voltage divider is provided, the divider ratio of which being dimensioned so that the divided-down transmitted clock signal of the clock generator at the side, where the light signal is simulated, is at least slightly greater than the reception signal of the adjacent light-emitting diode produced by parasitic reflection at the translucent surface.

15. Circuit according to claim 1, wherein the control device on the basis of the output signals is configured to control the light-emitting diodes in such a way that the light-emitting diode forming the display element is situated under the body.

16. Circuit according to claim 15, wherein the control device, when the body remains in an unvarying position between adjacent light-emitting diodes, is configured to switch back and forth between the adjacent light-emitting diodes, and increase the sensitivity for position detection until a preselected value is exceeded.

17. Circuit according to claim 16, wherein in the event of repeated switching back and forth, a decision aid is activated that sets the receiving element less and less sensitively until the light-emitting diode situated closer to the body is selectable and which then reverts to the state of sensitivity for the detection of further movement of the body.

18. Circuit according to claim 17, wherein the decision aid is a hysteresis detector.

19. Circuit according to one of claims 16, wherein the output signal at a instant of a changeover is referred to a specific preselected or preselectable value so that after the changeover a next threshold value is reached with a part of the output signal.

20. Circuit according to claim 1, wherein the output signal for the position of the body is ignored if at the same time a signal of the distance from the surface of or from the vicinity of the surface of the light-emitting diode changes with simultaneous removal of the body from the light-emitting diode.

21. Circuit according to claim 20, wherein, when the output signal for the position of the body during removal varies by more than a preselected value, the control device selects the light-emitting diode, at which the body last dwelt for longer than a preselected dwell time.

22. Circuit according to claim 1, wherein storage means are provided, and configured to store a last setting even in a de-energized state.

23. Circuit according to claim 1, wherein a plurality of rows of light-emitting diodes are cascaded in order to lengthen the operating path.

24. Circuit according to claim 1, wherein a last light-emitting diode of the row is functionally linked to a first light-emitting diode of the same row with simultaneous formation of a virtual turning knob.

25. Circuit according to claim 1, wherein the light-emitting diodes are arranged in the shape of an arc or circle.

26. Circuit according to claim 1, wherein the control device is configured to operate all of the light-emitting diodes up to a position of the body and/or up to a position of the receiving element as display elements to form a light strip.

* * * * *